(12) United States Patent
Dokai et al.

(10) Patent No.: US 8,228,765 B2
(45) Date of Patent: Jul. 24, 2012

(54) OPTICAL DISC

(75) Inventors: Yuya Dokai, Nagaokakyo (JP); Noboru Kato, Moriyama (JP); Ikuhei Kimura, Nara (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/295,153

(22) Filed: Nov. 14, 2011

(65) Prior Publication Data

US 2012/0056001 A1    Mar. 8, 2012

Related U.S. Application Data

(63) Continuation of application No. 12/326,916, filed on Dec. 3, 2008, now Pat. No. 8,081,541, which is a continuation of application No. PCT/JP2007/060605, filed on May 24, 2007.

(30) Foreign Application Priority Data

Jun. 30, 2006   (JP) .................................. 2006-182687

(51) Int. Cl.
    *G11B 11/00*   (2006.01)
(52) U.S. Cl. .................................... 369/13.38
(58) Field of Classification Search ............... 369/13.38, 369/13.35, 13.4, 13.41, 13.42, 13.23; 235/435, 235/486; 257/678; 343/700 MS, 850
    See application file for complete search history.

(56) References Cited

U.S. PATENT DOCUMENTS

| 3,364,564 A | 1/1968 | Kurtz et al. |
|---|---|---|
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |
| 5,757,074 A | 5/1998 | Matloubian et al. |
| 5,854,480 A | 12/1998 | Noto |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |
| 6,104,611 A | 8/2000 | Glover et al. |
| 6,107,920 A | 8/2000 | Eberhardt et al. |

(Continued)

FOREIGN PATENT DOCUMENTS

CA    2 279 176 A1    7/1998

(Continued)

OTHER PUBLICATIONS

Official communication issued in Japanese Application No. 2007-531524, mailed on Sep. 11, 2007.

(Continued)

*Primary Examiner* — Ali Neyzari
(74) *Attorney, Agent, or Firm* — Keating & Bennett, LLP (57) ABSTRACT

An optical disc includes an electromagnetic coupling module mounted therein. The electromagnetic coupling module includes a wireless IC chip and a feeder circuit substrate in which a feeder circuit including a resonant circuit having a predetermined resonant frequency is disposed. The electromagnetic coupling module is electromagnetically coupled to a reflective film defining a metal thin film of the optical disc, and the reflective film defines an antenna or radiation pattern of the electromagnetic coupling module.

6 Claims, 6 Drawing Sheets

U.S. PATENT DOCUMENTS

| | | |
|---|---|---|
| 6,172,608 B1 | 1/2001 | Cole |
| 6,181,287 B1 | 1/2001 | Beigel |
| 6,190,942 B1 | 2/2001 | Wilm et al. |
| 6,249,258 B1 | 6/2001 | Bloch et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,452,563 B1 | 9/2002 | Porte |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,812,707 B2 | 11/2004 | Yonezawa et al. |
| 6,828,881 B2 | 12/2004 | Mizutani et al. |
| 6,837,438 B1 | 1/2005 | Takasugi et al. |
| 6,861,731 B2 | 3/2005 | Buijsman et al. |
| 6,927,738 B2 | 8/2005 | Senba et al. |
| 6,963,729 B2 | 11/2005 | Uozumi |
| 7,088,249 B2 | 8/2006 | Senba et al. |
| 7,088,307 B2 | 8/2006 | Imaizumi |
| 7,112,952 B2 | 9/2006 | Arai et al. |
| 7,119,693 B1 | 10/2006 | Devilbiss |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 7,519,328 B2 * | 4/2009 | Dokai et al. ............. 455/41.2 |
| 7,630,685 B2 * | 12/2009 | Dokai et al. ............. 455/41.2 |
| 7,764,928 B2 * | 7/2010 | Dokai et al. ............. 455/41.2 |
| 8,078,106 B2 * | 12/2011 | Dokai et al. ............. 455/41.2 |
| 8,081,121 B2 * | 12/2011 | Kato et al. ........... 343/700 MS |
| 8,081,541 B2 * | 12/2011 | Dokai et al. ............. 369/13.38 |
| 2002/0011967 A1 | 1/2002 | Goff et al. |
| 2002/0015002 A1 | 2/2002 | Yasukawa et al. |
| 2002/0044092 A1 | 4/2002 | Kushihi |
| 2002/0067316 A1 | 6/2002 | Yokoshima et al. |
| 2002/0093457 A1 | 7/2002 | Hamada et al. |
| 2003/0006901 A1 | 1/2003 | Kim et al. |
| 2003/0020661 A1 | 1/2003 | Sato |
| 2003/0045324 A1 | 3/2003 | Nagumo et al. |
| 2003/0169153 A1 | 9/2003 | Muller |
| 2004/0001027 A1 | 1/2004 | Killen et al. |
| 2004/0026519 A1 | 2/2004 | Usami et al. |
| 2004/0056823 A1 | 3/2004 | Zuk et al. |
| 2004/0066617 A1 | 4/2004 | Hirabayashi et al. |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2004/0252064 A1 | 12/2004 | Yuanzhu |
| 2005/0092836 A1 | 5/2005 | Kudo |
| 2005/0099337 A1 | 5/2005 | Takei et al. |
| 2005/0125093 A1 | 6/2005 | Kikuchi et al. |
| 2005/0134460 A1 | 6/2005 | Usami |
| 2005/0134506 A1 | 6/2005 | Egbert |
| 2005/0138798 A1 | 6/2005 | Sakama et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0032926 A1 | 2/2006 | Baba et al. |
| 2006/0044192 A1 | 3/2006 | Egbert |
| 2006/0055601 A1 | 3/2006 | Kameda et al. |
| 2006/0071084 A1 | 4/2006 | Detig et al. |
| 2006/0109185 A1 | 5/2006 | Iwai et al. |
| 2006/0145872 A1 | 7/2006 | Tanaka et al. |
| 2006/0158380 A1 | 7/2006 | Son et al. |
| 2006/0170606 A1 | 8/2006 | Yamagajo et al. |
| 2006/0214801 A1 | 9/2006 | Murofushi et al. |
| 2006/0220871 A1 | 10/2006 | Baba et al. |
| 2006/0244676 A1 | 11/2006 | Uesaka |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0052613 A1 | 3/2007 | Gallschuetz et al. |
| 2007/0057854 A1 | 3/2007 | Oodachi et al. |
| 2007/0069037 A1 | 3/2007 | Kawai |
| 2007/0132591 A1 | 6/2007 | Khatri |
| 2007/0164414 A1 | 7/2007 | Dokai et al. |
| 2007/0200782 A1 | 8/2007 | Hayama et al. |
| 2007/0229276 A1 | 10/2007 | Yamagajo et al. |
| 2007/0247387 A1 | 10/2007 | Kubo et al. |
| 2007/0252700 A1 | 11/2007 | Ishihara et al. |
| 2007/0252703 A1 | 11/2007 | Kato et al. |
| 2007/0285335 A1 | 12/2007 | Bungo et al. |
| 2007/0290928 A1 | 12/2007 | Chang et al. |
| 2008/0024156 A1 | 1/2008 | Arai et al. |
| 2008/0087990 A1 | 4/2008 | Kato et al. |
| 2008/0169905 A1 | 7/2008 | Slatter |
| 2008/0272885 A1 | 11/2008 | Atherton |
| 2009/0002130 A1 | 1/2009 | Kato |
| 2009/0009007 A1 | 1/2009 | Kato et al. |
| 2009/0021352 A1 | 1/2009 | Kataya et al. |
| 2009/0021446 A1 | 1/2009 | Kataya et al. |
| 2009/0065594 A1 | 3/2009 | Kato et al. |
| 2009/0109102 A1 | 4/2009 | Dokai et al. |
| 2009/0160719 A1 | 6/2009 | Kato et al. |
| 2009/0201116 A1 | 8/2009 | Orihara |
| 2009/0224061 A1 | 9/2009 | Kato et al. |
| 2009/0231106 A1 | 9/2009 | Okamura |
| 2009/0262041 A1 | 10/2009 | Ikemoto et al. |
| 2009/0278687 A1 | 11/2009 | Kato |
| 2009/0321527 A1 | 12/2009 | Kato et al. |
| 2010/0103058 A1 | 4/2010 | Kato et al. |
| 2011/0031320 A1 | 2/2011 | Kato et al. |
| 2011/0063184 A1 | 3/2011 | Furumura et al. |

FOREIGN PATENT DOCUMENTS

| | | |
|---|---|---|
| DE | 10 2006 057 369 A1 | 6/2008 |
| EP | 0 694 874 A2 | 1/1996 |
| EP | 0 948 083 A2 | 10/1999 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 193 793 A2 | 4/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 547 753 A1 | 6/2005 |
| EP | 1 548 872 A1 | 6/2005 |
| EP | 1 703 589 A1 | 9/2006 |
| EP | 1 744 398 A1 | 1/2007 |
| EP | 1 841 005 A1 | 10/2007 |
| EP | 1 865 574 A1 | 12/2007 |
| EP | 1 976 056 A1 | 10/2008 |
| EP | 1 988 491 A1 | 11/2008 |
| EP | 1 993 170 A1 | 11/2008 |
| EP | 2 009 738 A1 | 12/2008 |
| EP | 2 012 258 A1 | 1/2009 |
| EP | 2 148 449 A1 | 1/2010 |
| EP | 2 251 934 A1 | 11/2010 |
| GB | 2 305 075 A | 3/1997 |
| GB | 2461443 A | 1/2010 |
| JP | 50-143451 A | 11/1975 |
| JP | 61-284102 A | 12/1986 |
| JP | 62-127140 U | 8/1987 |
| JP | 02-164105 A | 6/1990 |
| JP | 02-256208 A | 10/1990 |
| JP | 03-503467 A | 8/1991 |
| JP | 03-262313 A | 11/1991 |
| JP | 04-150011 A | 5/1992 |
| JP | 04-167500 A | 6/1992 |
| JP | 04-096814 U | 8/1992 |
| JP | 04-101168 U | 9/1992 |

| | | | | | | |
|---|---|---|---|---|---|---|
| JP | 04-134807 U | 12/1992 | | JP | 2007-18067 A | 1/2001 |
| JP | 05-327331 A | 12/1993 | | JP | 2001-043340 A | 2/2001 |
| JP | 6-53733 A | 2/1994 | | JP | 2001-66990 A | 3/2001 |
| JP | 06-077729 A | 3/1994 | | JP | 2001-76111 A | 3/2001 |
| JP | 06-177635 A | 6/1994 | | JP | 2001-101369 A | 4/2001 |
| JP | 6-260949 A | 9/1994 | | JP | 2001-505682 A | 4/2001 |
| JP | 07-183836 A | 7/1995 | | JP | 2001-168628 A | 6/2001 |
| JP | 08-055725 A | 2/1996 | | JP | 2001-188890 A | 7/2001 |
| JP | 08-056113 A | 2/1996 | | JP | 2001-240046 A | 9/2001 |
| JP | 8-87580 A | 4/1996 | | JP | 2001-256457 A | 9/2001 |
| JP | 08-88586 A | 4/1996 | | JP | 2001-257292 A | 9/2001 |
| JP | 08-088586 A | 4/1996 | | JP | 2001-514777 A | 9/2001 |
| JP | 11-149537 A | 6/1996 | | JP | 2001-319380 A | 11/2001 |
| JP | 08-176421 A | 7/1996 | | JP | 2001-331976 A | 11/2001 |
| JP | 08-180160 A | 7/1996 | | JP | 2001-332923 A | 11/2001 |
| JP | 08-279027 A | 10/1996 | | JP | 2001-339226 A | 12/2001 |
| JP | 08-307126 A | 11/1996 | | JP | 2001-344574 A | 12/2001 |
| JP | 08-330372 A | 12/1996 | | JP | 2001-351083 A | 12/2001 |
| JP | 09-014150 A | 1/1997 | | JP | 2001-351084 A | 12/2001 |
| JP | 09-035025 A | 2/1997 | | JP | 2001-352176 A | 12/2001 |
| JP | 09-093029 A | 4/1997 | | JP | 2002-024776 A | 1/2002 |
| JP | 9-93029 A | 4/1997 | | JP | 2002-026513 A | 1/2002 |
| JP | 09-245381 A | 9/1997 | | JP | 2002-32731 A | 1/2002 |
| JP | 09-252217 A | 9/1997 | | JP | 2002-042076 A | 2/2002 |
| JP | 09-270623 A | 10/1997 | | JP | 2002-063557 A | 2/2002 |
| JP | 09-284038 A | 10/1997 | | JP | 2002-505645 A | 2/2002 |
| JP | 9-512367 A | 12/1997 | | JP | 2002-76750 A | 3/2002 |
| JP | 10-069533 A | 3/1998 | | JP | 2002-076750 A | 3/2002 |
| JP | 10-69533 A | 3/1998 | | JP | 2002-111363 A | 4/2002 |
| JP | 10-505466 A | 5/1998 | | JP | 2002-150245 A | 5/2002 |
| JP | 10-171954 A | 6/1998 | | JP | 2002-157564 A | 5/2002 |
| JP | 10-193849 A | 7/1998 | | JP | 2002-158529 A | 5/2002 |
| JP | 10-193851 A | 7/1998 | | JP | 2002-175508 A | 6/2002 |
| JP | 10-293828 A | 11/1998 | | JP | 2002-183690 A | 6/2002 |
| JP | 11-025244 A | 1/1999 | | JP | 2002-185358 A | 6/2002 |
| JP | 11-039441 A | 2/1999 | | JP | 2002-204117 A | 7/2002 |
| JP | 11-075329 A | 3/1999 | | JP | 2002-522849 A | 7/2002 |
| JP | 11-085937 A | 3/1999 | | JP | 2002-230128 A | 8/2002 |
| JP | 11-88241 A | 3/1999 | | JP | 2002-232221 A | 8/2002 |
| JP | 11-102424 A | 4/1999 | | JP | 2002-252117 A | 9/2002 |
| JP | 11-103209 A | 4/1999 | | JP | 2002-259934 A | 9/2002 |
| JP | 11-149536 A | 6/1999 | | JP | 2002-280821 A | 9/2002 |
| JP | 11-149538 A | 6/1999 | | JP | 2002-298109 A | 10/2002 |
| JP | 11-219420 A | 8/1999 | | JP | 2002-308437 A | 10/2002 |
| JP | 11-220319 A | 8/1999 | | JP | 2002-319008 A | 10/2002 |
| JP | 11-282993 A | 10/1999 | | JP | 2002-319009 A | 10/2002 |
| JP | 11-328352 A | 11/1999 | | JP | 2002-319812 A | 10/2002 |
| JP | 11-331014 A | 11/1999 | | JP | 2002-362613 A | 12/2002 |
| JP | 11-346114 A | 12/1999 | | JP | 2002-366917 A | 12/2002 |
| JP | 11-515094 A | 12/1999 | | JP | 2002-373029 A | 12/2002 |
| JP | 2000-21128 A | 1/2000 | | JP | 2002-373323 A | 12/2002 |
| JP | 2000-021639 A | 1/2000 | | JP | 2002-374139 A | 12/2002 |
| JP | 2000-022421 A | 1/2000 | | JP | 2003-006599 A | 1/2003 |
| JP | 2005-229474 A | 1/2000 | | JP | 2003-016412 A | 1/2003 |
| JP | 2000-059260 A | 2/2000 | | JP | 2003-022912 A | 1/2003 |
| JP | 2000-085283 A | 3/2000 | | JP | 2003-026177 A | 1/2003 |
| JP | 2000-090207 A | 3/2000 | | JP | 2003-030612 A | 1/2003 |
| JP | 2000-132643 A | 5/2000 | | JP | 2003-44789 A | 2/2003 |
| JP | 2000-137778 A | 5/2000 | | JP | 2003-046318 A | 2/2003 |
| JP | 2000-137779 A | 5/2000 | | JP | 2003-58840 A | 2/2003 |
| JP | 2000-137785 A | 5/2000 | | JP | 2003-067711 A | 3/2003 |
| JP | 2000-148948 A | 5/2000 | | JP | 2003-069335 A | 3/2003 |
| JP | 2000-172812 A | 6/2000 | | JP | 2003-076947 A | 3/2003 |
| JP | 2000-209013 A | 7/2000 | | JP | 2003-76963 A | 3/2003 |
| JP | 2000-222540 A | 8/2000 | | JP | 2003-78333 A | 3/2003 |
| JP | 2000-510271 A | 8/2000 | | JP | 2003-078336 A | 3/2003 |
| JP | 2000-242754 A | 9/2000 | | JP | 2003-085501 A | 3/2003 |
| JP | 2000-243797 A | 9/2000 | | JP | 2003-085520 A | 3/2003 |
| JP | 2000-251049 A | 9/2000 | | JP | 2003-87008 A | 3/2003 |
| JP | 2000-261230 A | 9/2000 | | JP | 2003-87044 A | 3/2003 |
| JP | 2000-276569 A | 10/2000 | | JP | 2003-099720 A | 4/2003 |
| JP | 2000-286634 A | 10/2000 | | JP | 2003-099721 A | 4/2003 |
| JP | 2000-286760 A | 10/2000 | | JP | 2003-110344 A | 4/2003 |
| JP | 2000-311226 A | 11/2000 | | JP | 2003-132330 A | 5/2003 |
| JP | 2000-321984 A | 11/2000 | | JP | 2003-134007 A | 5/2003 |
| JP | 3075400 U | 11/2000 | | JP | 2003-155062 A | 5/2003 |
| JP | 2000-349680 A | 12/2000 | | JP | 2003-158414 A | 5/2003 |
| JP | 2001-10264 A | 1/2001 | | JP | 2003-168760 A | 6/2003 |
| JP | 2001-028036 A | 1/2001 | | JP | 2003-179565 A | 6/2003 |

| | | | | | | |
|---|---|---|---|---|---|---|
| JP | 2003-187207 A | 7/2003 | | JP | 2005-352858 A | 12/2005 |
| JP | 2003-187211 A | 7/2003 | | JP | 2006-13976 A | 1/2006 |
| JP | 2003-188338 A | 7/2003 | | JP | 2006-013976 A | 1/2006 |
| JP | 2003-188620 A | 7/2003 | | JP | 2006-025390 A | 1/2006 |
| JP | 2003-198230 A | 7/2003 | | JP | 2006-031766 A | 2/2006 |
| JP | 2003-209421 A | 7/2003 | | JP | 2006-033312 A | 2/2006 |
| JP | 2003-216919 A | 7/2003 | | JP | 2006-39902 A | 2/2006 |
| JP | 2003-218624 A | 7/2003 | | JP | 2006-039947 A | 2/2006 |
| JP | 2003-233780 A | 8/2003 | | JP | 2006-42059 A | 2/2006 |
| JP | 2003-242471 A | 8/2003 | | JP | 2006-42097 A | 2/2006 |
| JP | 2003-243918 A | 8/2003 | | JP | 2006-053833 A | 2/2006 |
| JP | 2003-249813 A | 9/2003 | | JP | 2006-67479 A | 3/2006 |
| JP | 2003-529163 A | 9/2003 | | JP | 2006-72706 A | 3/2006 |
| JP | 2003-288560 A | 10/2003 | | JP | 2006-80367 A | 3/2006 |
| JP | 2003-309418 A | 10/2003 | | JP | 2006-92630 A | 4/2006 |
| JP | 2003-317060 A | 11/2003 | | JP | 2006-102953 A | 4/2006 |
| JP | 2003-331246 A | 11/2003 | | JP | 2006-107296 A | 4/2006 |
| JP | 2003-332820 A | 11/2003 | | JP | 2006-513594 A | 4/2006 |
| JP | 2003-536302 A | 12/2003 | | JP | 2006-148462 A | 6/2006 |
| JP | 2004-040597 A | 2/2004 | | JP | 2006-148518 A | 6/2006 |
| JP | 2004-505481 A | 2/2004 | | JP | 2006-151402 A | 6/2006 |
| JP | 2004-082775 A | 3/2004 | | JP | 2006-174151 A | 6/2006 |
| JP | 2004-88218 A | 3/2004 | | JP | 2006-195795 A | 7/2006 |
| JP | 2004-93693 A | 3/2004 | | JP | 2006-203187 A | 8/2006 |
| JP | 2004-096566 A | 3/2004 | | JP | 2006-203852 A | 8/2006 |
| JP | 2004-127230 A | 4/2004 | | JP | 2006-217000 A | 8/2006 |
| JP | 2004-140513 A | 5/2004 | | JP | 2006-232292 A | 9/2006 |
| JP | 2004-213582 A | 7/2004 | | JP | 2006-237674 A | 9/2006 |
| JP | 2004-519916 A | 7/2004 | | JP | 2006-270212 A | 10/2006 |
| JP | 2004-234595 A | 8/2004 | | JP | 2006-270681 A | 10/2006 |
| JP | 2004-253858 A | 9/2004 | | JP | 2006-270766 A | 10/2006 |
| JP | 2004-527864 A | 9/2004 | | JP | 2006-285911 A | 10/2006 |
| JP | 2004-280390 A | 10/2004 | | JP | 2006-295879 A | 10/2006 |
| JP | 2004-282403 A | 10/2004 | | JP | 2006-302219 A | 11/2006 |
| JP | 2004-287767 A | 10/2004 | | JP | 2006-309401 A | 11/2006 |
| JP | 2004-297249 A | 10/2004 | | JP | 2006-311239 A | 11/2006 |
| JP | 2004-297681 A | 10/2004 | | JP | 2006-323481 A | 11/2006 |
| JP | 2004-304370 A | 10/2004 | | JP | 2006-339964 A | 12/2006 |
| JP | 2004-319848 A | 11/2004 | | JP | 2007-007888 A | 1/2007 |
| JP | 2004-326380 A | 11/2004 | | JP | 2007-13120 A | 1/2007 |
| JP | 2004-334268 A | 11/2004 | | JP | 2007-28002 A | 2/2007 |
| JP | 2004-336250 A | 11/2004 | | JP | 2007-043535 A | 2/2007 |
| JP | 2004-343000 A | 12/2004 | | JP | 2007-048126 A | 2/2007 |
| JP | 2004-362190 A | 12/2004 | | JP | 2007-65822 A | 3/2007 |
| JP | 2004-362341 A | 12/2004 | | JP | 2007-79687 A | 3/2007 |
| JP | 2004-362602 A | 12/2004 | | JP | 2007-81712 A | 3/2007 |
| JP | 2005-5866 A | 1/2005 | | JP | 2007-096768 A | 4/2007 |
| JP | 2005-18156 A | 1/2005 | | JP | 2007-102348 A | 4/2007 |
| JP | 2005-033461 A | 2/2005 | | JP | 2007-116347 A | 5/2007 |
| JP | 2005-124061 A | 5/2005 | | JP | 2007-122542 A | 5/2007 |
| JP | 2005-128592 A | 5/2005 | | JP | 2007-150642 A | 6/2007 |
| JP | 2005-129019 A | 5/2005 | | JP | 2007-150868 A | 6/2007 |
| JP | 2005-135132 A | 5/2005 | | JP | 2007-159083 A | 6/2007 |
| JP | 2005-136528 A | 5/2005 | | JP | 2007-159129 A | 6/2007 |
| JP | 2005-137032 A | 5/2005 | | JP | 2007-166133 A | 6/2007 |
| JP | 3653099 B2 | 5/2005 | | JP | 2007-172369 A | 7/2007 |
| JP | 2005-165839 A | 6/2005 | | JP | 2007-172527 A | 7/2007 |
| JP | 2005-167327 A | 6/2005 | | JP | 2007-228325 A | 9/2007 |
| JP | 2005-167813 A | 6/2005 | | JP | 2007-266999 A | 10/2007 |
| JP | 2005-190417 A | 7/2005 | | JP | 2007-272264 A | 10/2007 |
| JP | 2005-191705 A | 7/2005 | | JP | 2007-287128 A | 11/2007 |
| JP | 2005-192124 A | 7/2005 | | JP | 2007-295557 A | 11/2007 |
| JP | 2005-210676 A | 8/2005 | | JP | 2007-312350 A | 11/2007 |
| JP | 2005-210680 A | 8/2005 | | JP | 2007-324865 A | 12/2007 |
| JP | 2005-217822 A | 8/2005 | | JP | 2008-033716 A | 2/2008 |
| JP | 2005-236339 A | 9/2005 | | JP | 2008-72243 A | 3/2008 |
| JP | 2005-244778 A | 9/2005 | | JP | 2008-083867 A | 4/2008 |
| JP | 2005-252853 A | 9/2005 | | JP | 2008-097426 A | 4/2008 |
| JP | 2005-275870 A | 10/2005 | | JP | 4069958 B2 | 4/2008 |
| JP | 2005-284352 A | 10/2005 | | JP | 2008-107947 A | 5/2008 |
| JP | 2005-293537 A | 10/2005 | | JP | 2008-148345 A | 6/2008 |
| JP | 2005-295135 A | 10/2005 | | JP | 2008-519347 A | 6/2008 |
| JP | 2005-311205 A | 11/2005 | | JP | 2008-160874 A | 7/2008 |
| JP | 2005-321305 A | 11/2005 | | JP | 2008-197714 A | 8/2008 |
| JP | 2005-322119 A | 11/2005 | | JP | 2008-288915 A | 11/2008 |
| JP | 2005-335755 A | 12/2005 | | JP | 11-175678 A | 1/2009 |
| JP | 2005-340759 A | 12/2005 | | JP | 2009-25870 A | 2/2009 |
| JP | 2005-345802 A | 12/2005 | | JP | 2009-27291 A | 2/2009 |
| JP | 2005-346820 A | 12/2005 | | JP | 2009-044715 A | 2/2009 |

| | | | |
|---|---|---|---|
| JP | 3148168 U | 2/2009 | |
| JP | 2009-182630 A | 8/2009 | |
| JP | 2010-009196 A | 1/2010 | |
| JP | 4609604 B2 | 1/2011 | |
| NL | 9100176 A | 3/1992 | |
| NL | 9100347 A | 3/1992 | |
| WO | 98/33142 A1 | 7/1998 | |
| WO | 99/67754 A1 | 12/1999 | |
| WO | 00/10122 A2 | 2/2000 | |
| WO | 01/95242 A2 | 12/2001 | |
| WO | 02/48980 A1 | 6/2002 | |
| WO | 02/061675 A1 | 8/2002 | |
| WO | 02/097723 A1 | 12/2002 | |
| WO | 03/079305 A1 | 9/2003 | |
| WO | 2004/036772 A1 | 4/2004 | |
| WO | 2004/070879 A | 8/2004 | |
| WO | 2004/072892 A1 | 8/2004 | |
| WO | 2005/073937 A | 8/2005 | |
| WO | 2005/091434 A1 | 9/2005 | |
| WO | 2005/115849 A1 | 12/2005 | |
| WO | 2006/045682 A | 5/2006 | |
| WO | 2006/048663 A1 | 5/2006 | |
| WO | 2006/114821 A1 | 11/2006 | |
| WO | 2007/083574 A1 | 7/2007 | |
| WO | 2007/083575 A1 | 7/2007 | |
| WO | 2007/086130 A1 | 8/2007 | |
| WO | 2007/097385 A1 | 8/2007 | |
| WO | 2007/102360 A1 | 9/2007 | |
| WO | 2007/105348 A1 | 9/2007 | |
| WO | 2007/119310 A1 | 10/2007 | |
| WO | 2007/125683 A1 | 11/2007 | |
| WO | 2007/138857 A1 | 12/2007 | |
| WO | 2008/007606 A | 1/2008 | |
| WO | 2008/081699 A1 | 7/2008 | |
| WO | 2008/126458 A1 | 10/2008 | |
| WO | 2008/133018 A1 | 11/2008 | |
| WO | 2008/140037 A1 | 11/2008 | |
| WO | 2008/142957 A1 | 11/2008 | |
| WO | 2009/011144 A1 | 1/2009 | |
| WO | 2009/011376 A1 | 1/2009 | |
| WO | 2009/011423 A1 | 1/2009 | |
| WO | 2009/081719 A1 | 7/2009 | |
| WO | 2009/110381 A1 | 9/2009 | |

OTHER PUBLICATIONS

Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official Communication issued in International Patent Application No. PCT/JP2009/066336, mailed on Dec. 22, 2009.
Official Communication issued in corresponding Japanese Patent Application No. 2010-509439, mailed on Jul. 6, 2010.
Official Communication issued in corresponding Japanese Patent Application No. 2011-032311, mailed on Mar. 29, 2011.
Official Communication issued in corresponding Japanese Patent Application No. 2009-525327, drafted on Sep. 22, 2010.
Official Communication issued in corresponding Japanese Patent Application No. 2011-032311, mailed on Aug. 2, 2011.
Official Communication issued in corresponding Japanese Patent Application No. 2011-032312, mailed on Aug. 2, 2011.
Official Communication issued in corresponding Japanese Patent Application No. 2011-032311, mailed on Aug. 23, 2011.
Kato et al.: "Wireless IC Device Component and Wireless IC Device"; U.S. Appl. No. 13/241,823, filed Sep. 23, 2011.
Kato et al.: "Antenna Device and Method of Setting Resonant Frequency of Antenna Device"; U.S. Appl. No. 13/272,365, filed Oct. 13, 2011.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556 filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official Communication issued in International Patent Application No. PCT/JP2009/069486, mailed on Mar. 2, 2010.

Kato: "Radio IC Device"; U.S. Appl. No. 13/080,775, filed Apr. 6, 2011.
Kato et al.: "Antenna and Wireless IC Device"; U.S. Appl. No. 13/083,626, filed Apr. 11, 2011.
Official Communication issued in International Patent Application No. PCT/JP2009/070617, mailed on Mar. 16, 2010.
Nagai, "Mounting Technique of RFID by Roll-To-Roll Process", Material Stage, Technical Information Institute Co., Ltd, vol. 7, No. 9, 2007, pp. 4-12.
Dokai et al.: "Wireless IC Device"; U.S. Appl. No. 13/088,480, filed Apr. 18, 2011.
Kato et al.: "High-Frequency Device and Wireless IC Device"; U.S. Appl. No. 13/094,928, filed Apr. 27, 2011.
Dokai et al.: "Wireless IC Device", U.S. Appl. No. 13/099,392, filed May 3, 2011.
Kato et al.: "Radio Frequency IC Device"; U.S. Appl. No. 13/163,803, filed Jun. 20, 2011.
Official Communication issued in International Patent Application No. PCT/JP2010/050170, mailed on Apr. 13, 2010.
Official Communication issued in International Patent Application No. PCT/JP2010/051205, mailed on May 11, 2010.
Kato: "Wireless IC Device, Wireless IC Module and Method of Manufacturing Wireless IC Module"; U.S. Appl. No. 13/169,067, filed Jun. 27, 2011.
Kato et al.: "Antenna and Wireless IC Device"; U.S. Appl. No. 13/190,670, filed Jul. 26, 2011.
Shiroki et al.: "RFIC Chip Mounting Structure"; U.S. Appl. No. 13/223,429, filed Sep. 1, 2011.
Official Communication issued in International Patent Application No. PCT/JP2010/056559, mailed on Jul. 27, 2010.
Taniguchi et al.: "Antenna Device and Radio Frequency IC Device"; U.S. Appl. No. 13/232,102, filed Sep. 14, 2011.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module," U.S. Appl. No. 12/536,669, filed Aug. 6, 2009.
Dokai et al.: "Wireless IC Device and Component for Wireless IC Device," U.S. Appl. No. 12/543,553, filed Aug. 19, 2009.
Shioya et al.: "Wireless IC Device," U.S. Appl. No. 12/551,037, filed Aug. 31, 2009.
Ikemoto: "Wireless IC Device and Manufacturing Method Thereof," U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2008/063025, mailed on Aug. 12, 2008.
Kato et al.: "Wireless IC Device," U.S. Appl. No. 12/603,608, filed Oct. 22, 2009.
Kato et al.: "Wireless IC Device," U.S. Appl. No. 12/688,072, filed Jan. 15, 2010.
Official Communication issued in International Patent Application No. PCT/JP2009/053693, mailed on Jun. 9, 2009.
Kato: "Composite Antenna," U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System," U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device," U.S. Appl. No. 12/859,880, filed Aug. 20, 2010.
Official Communication issued in International Patent Application No. PCT/JP2009/057482, mailed on Jul. 21, 2009.

Kataya et al.: "Wireless IC Device, Electronic Apparatus, and Method for Adjusting Resonant Frequency of Wireless IC Device," U.S. Appl. No. 12/861,945, filed Aug. 24, 2010.
Kato: "Wireless IC Device and Electromagnetic Coupling Module," U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device" U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: Wireless IC Device and Manufacturing Method Thereof; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.
Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official communication issued in counterpart International Application No. PCT/JP2008/071502, mailed Feb. 24, 2009.
Kato et al.: "Wireless IC Device and Manufacturing Method Thereof," U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device," U.S. Appl. No. 12/469,896, filed May 21, 2009.
Ikemoto et al.: "Wireless IC Device," U.S. Appl. No. 12/496,709, filed Jul. 2, 2009.
Official communication issued in counterpart International Application No. PCT/JP2008/062947, mailed Aug. 19, 2008.
Official communiciation issued in counterpart International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.

Official communication issued in counterpart International Application No. PCT/JP2008/057239, mailed Jul. 22, 2008.
Kimura et al.: "Wireless IC Device," U.S. Appl. No. 12/510,338, filed Jul. 28, 2009.
Kato et al.: "Wireless IC Device," U.S. Appl. No. 12/510,340, filed Jul. 28, 2009.
Kato: "Wireless IC Device," U.S. Appl. No. 12/510,344, filed Jul. 28, 2009.
Kato et al.: "Wireless IC Device," U.S. Appl. No. 12/510,347, filed Jul. 28, 2009.

* cited by examiner

OPTICAL DISC

BACKGROUND OF THE INVENTION

1. Field of the Invention

The present invention relates to optical discs and in particular, to an optical disc in which an electromagnetic coupling module having a wireless integrated circuit (IC) chip for use in a radio frequency identification (RFID) system is disposed.

2. Description of the Related Art

Recently, digital versatile discs (DVDs) have become very popular as media capable of recording a large amount of data, such as video and audio data. With the desire to record longer video data having higher image quality, the development of optical discs whose light source is a blue semiconductor laser is rapidly advancing, and one example of this type of optical discs is a Blu-ray disc (BD) that is currently commercially available.

When a portable recording media is capable of easily storing high-quality digital contents, the protection of the copyright of the digital contents becomes very important. BDs perform control so as to prevent unauthorized discs from being played by causing a player to read a unique ID recorded in the innermost area of a signal recordable region, called a burst cutting area, for each disc as a bar-code pattern. However, techniques for creating unauthorized discs are rapidly advancing, such that more robust measures for copyright protection are desired.

To address this issue, a DVD having a structure in which an RFID tag is incorporated to prevent unauthorized duplication is disclosed in Japanese Unexamined Patent Application Publication No. 9-245381 and Japanese Unexamined Patent Application Publication No. 2006-92630. In Japanese Unexamined Patent Application Publication No. 9-245381, an antenna pattern is provided in an area that is adjacent to the central hole and that does not include a reflective film provided therein. This limits the size of the antenna pattern, such that a relatively large gain cannot be obtained and the reading distance by an RFID reader/writer is undesirably small. One possible solution is to provide the antenna pattern on the back surface of a signal recordable region at which a reflective film is provided. However, with this approach, if the antenna pattern and the reflective film overlap, communications are adversely affected.

In Japanese Unexamined Patent Application Publication No. 2006-92630, an RFID tag is provided which has a slot antenna structure in which a slit is provided on each of an inner portion and an outer portion of a reflective film that are not disposed in a signal recordable region. However, because slot antennas have relatively high impedances, it is difficult to perform matching to the impedance of a wireless IC chip of the RFID. As a result, a problem occurs in which a sufficient antenna gain cannot be obtained.

SUMMARY OF THE INVENTION

To overcome the problems described above, preferred embodiments of the present invention provide an optical disc that includes an electromagnetic coupling module having high electromagnetic-wave radiation efficiency in a wide band and that is suitable for copyright protection.

A preferred embodiment of the present invention provides an optical disc in which an electromagnetic coupling module is mounted, wherein the electromagnetic coupling module includes a wireless IC chip and a feeder circuit substrate in which a feeder circuit including a resonant circuit having a predetermined resonant frequency is disposed, and the electromagnetic coupling module is electromagnetically coupled to a reflective film defining a metal thin film of the optical disc, and the reflective film is used as an antenna radiator of the electromagnetic coupling module.

In the optical disc according to this preferred embodiment of the present invention, the electromagnetic coupling module including the wireless IC chip and the feeder circuit substrate is electromagnetically coupled to the reflective film defining the metal thin film of the optical disc. An excitation of the reflective film improves the electromagnetic-wave radiation efficiency. An improved antenna gain increases the acceptable distance to an RFID reader/writer.

In the optical disc according to this preferred embodiment of the present invention, the wireless IC chip may preferably be disposed on the feeder circuit substrate, and the reflective film may preferably face a surface of the feeder circuit substrate on which the wireless IC chip is not disposed. With this arrangement, the electromagnetic coupling between the electromagnetic coupling module and the reflective film is improved.

The electromagnetic coupling module may preferably be disposed in a region other than a signal recordable region of the optical disc. The effects on the reading of the recorded information from the optical disc that is caused by mounting the electromagnetic coupling module in the optical disc can be avoided.

The resonant circuit disposed in the feeder circuit substrate may include an inductance element defined by a linear electrode. The linear electrode defining the inductance element improves the electromagnetic coupling to the reflective film.

When a plurality of resonant circuits defines the resonant circuit disposed in the feeder circuit substrate, impedance matching between the wireless IC chip and the feeder circuit and impedance matching between the feeder circuit and the reflective film can be preferably performed in a wide frequency band.

The optical disc may be a digital versatile disc (DVD) or a compact disc (CD), a soft key for playback may be provided in a recording surface of the DVD or the CD, and the soft key for playback may be stored in the wireless IC chip. This enables effective protection of a copyright against unauthorized duplication and other piracy.

According to various preferred embodiments of the present invention, because the reflective film disposed in the optical disc is used as the antenna radiator of the electromagnetic coupling module in which the wireless IC chip is disposed, an electromagnetic-wave radiation efficiency is improved in a wide band. In addition, information stored in the wireless IC chip can be obtained using an RFID system, and the obtained information can be effectively utilized for copyright protection.

Other features, elements, steps, characteristics and advantages of the present invention will become more apparent from the following detailed description of preferred embodiments of the present invention with reference to the attached drawings

DETAILED DESCRIPTION OF PREFERRED EMBODIMENTS

Preferred embodiments of an optical disc according to the present invention will be described below with reference to the accompanying drawings.

General Configuration of Optical Disc and Electromagnetic Coupling Module

Figure 1:
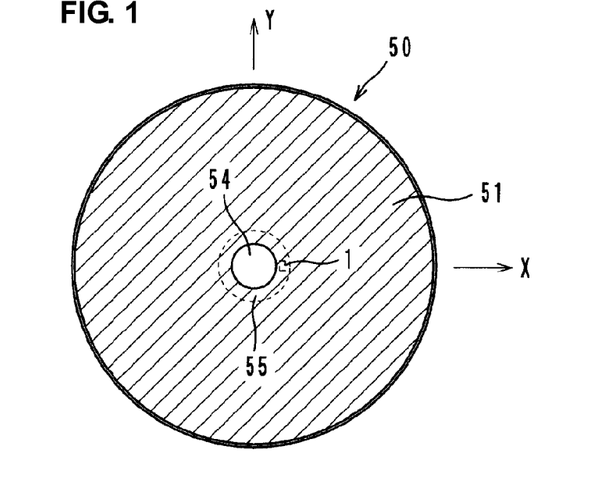
FIG. 1 is a plan view that illustrates an optical disc according to a preferred embodiment of the present invention.
Figure 2:
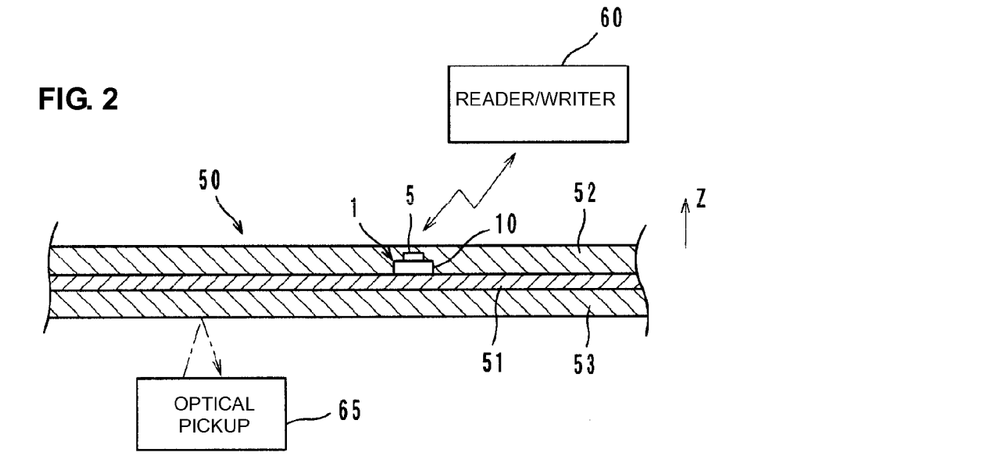
FIG. 2 is a cross-sectional view that illustrates an enlarged main portion of the optical disc shown in FIG. 1.

A plan view of an optical disc 50 according to a preferred embodiment of the present invention is shown in FIG. 1, and a cross-sectional view that illustrates an enlarged main portion thereof is shown in FIG. 2. The optical disc 50 is a CD, a DVD, or a BD for example. As illustrated in FIG. 2, the optical disc 50 has a three-layer structure in which a reflective film 51 preferably made of an aluminum-deposited film, for example, is disposed between polycarbonate resin layers 52 and 53 arranged on the upper and lower surfaces thereof. The reflective film 51 defines an antenna or radiation pattern. The diagonally shaded portion in FIG. 1 is the portion in which the reflective film 51 is provided. In the reflective film 51, a portion surrounding a central hole 54 is a non-recordable region 55, and the remaining portion thereof is a recordable region. Information recorded in the reflective film 51 is read by an optical pickup 65.

An electromagnetic coupling module 1, which will be described below, is embedded in the non-recordable region 55. The location of attachment of the electromagnetic coupling module 1 to the optical disc 50 may be in the outer portion of the reflective film 51, as opposed to the inner portion, or may be on the back surface side of the recordable region.

Figure 3:
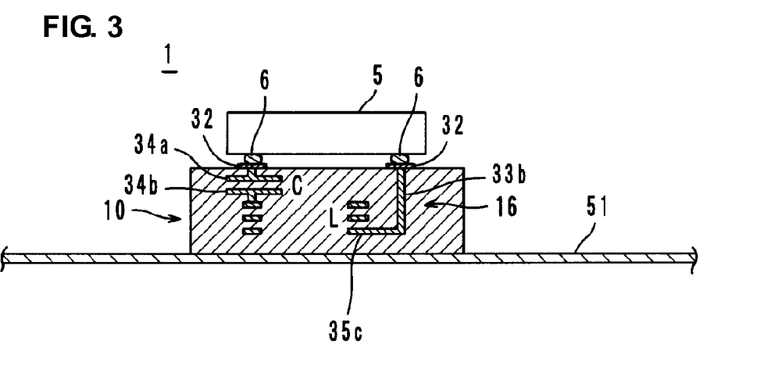
FIG. 3 is a cross-sectional view that illustrates a feeder circuit substrate according to a first preferred embodiment of the present invention.

As illustrated in the cross-sectional view of FIG. 3, the electromagnetic coupling module 1 includes a known wireless IC chip 5 used in an RFID system and a feeder circuit substrate 10 in which a feeder circuit 16 having a predetermined resonant frequency is disposed. The wireless IC chip 5 is mounted on the front side of the feeder circuit substrate 10. The back side (i.e., the surface on which the wireless IC chip 5 is not disposed) of the feeder circuit substrate 10 faces the reflective film 51.

The wireless IC chip 5 includes a clock circuit, a logic circuit, and a memory circuit, stores necessary information, and is DC-connected directly to the feeder circuit 16 included in the feeder circuit substrate 10.

The feeder circuit 16 is a circuit arranged to supply the reflective film 51 with a transmission signal having a predetermined frequency and also to select a reception signal having a predetermined frequency from signals received at the reflective film 51 and supply the reception signal to the wireless IC chip 5. The feeder circuit 16 includes a resonant circuit that resonates at the frequency of each of the transmission and reception signals.

Figure 4A:
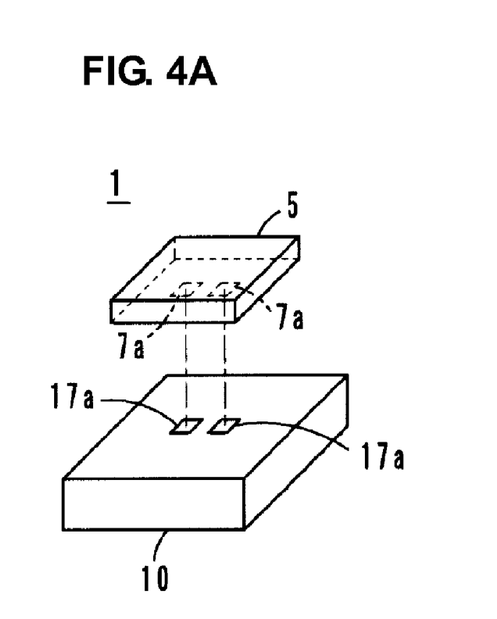
FIGS. 4A and 4B are perspective views that illustrate connection states between a wireless IC chip and the feeder circuit substrate.
Figure 4B:
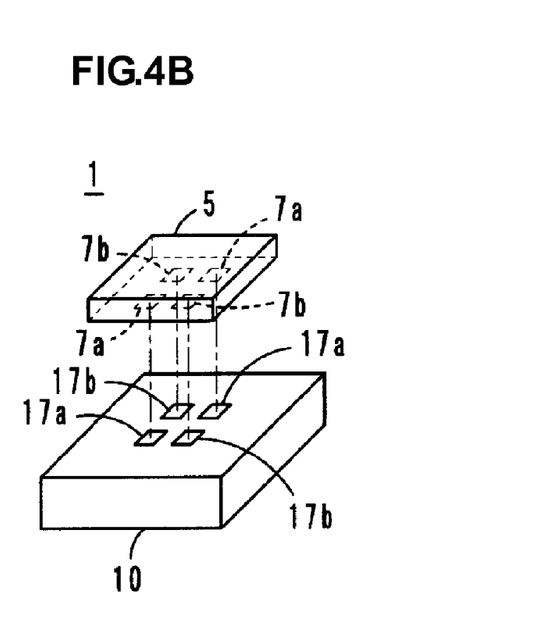

The perspective views of FIGS. 4A and 4B illustrate connection structures between the wireless IC chip 5 and the feeder circuit substrate 10. FIG. 4A illustrates a connection structure in which pairs of antenna (balance) terminals 7a and 17a are disposed on the back surface side of the wireless IC chip 5 and the front surface side of the feeder circuit substrate 10, respectively. FIG. 4B illustrates another connection structure in which, in addition to the pairs of antenna (balance) terminals 7a and 17a, pairs of ground terminals 7b and 17b are disposed on the back surface side of the wireless IC chip 5 and the front surface side of the feeder circuit substrate 10, respectively. The ground terminals 17b of the feeder circuit substrate 10 are terminated, such that they are not connected to another terminal of the feeder circuit substrate 10.

Figure 5:
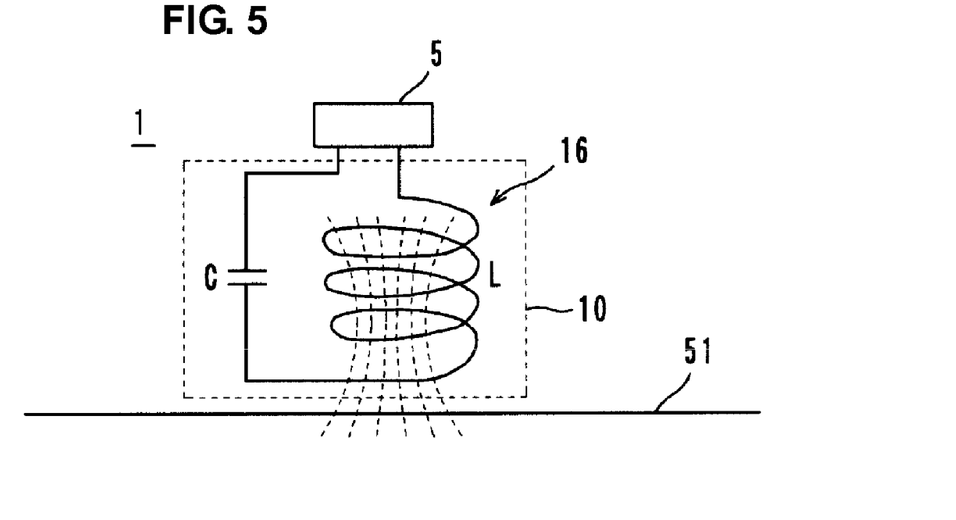
FIG. 5 is an equivalent circuit diagram of the feeder circuit substrate according to the first preferred embodiment of the present invention.

First Preferred Embodiment of Feeder Circuit Substrate According to the Present Invention As illustrated in FIGS. 3 and 5, as equivalent circuits, the feeder circuit substrate 10 includes the feeder circuit 16 including a series LC lumped-constant resonant circuit including a helical inductance element L and a capacitance element C. As illustrated in FIG. 5, a coil electrode pattern defining the inductance element L is arranged such that its winding axis is substantially perpendicular to the reflective film 51, and the feeder circuit 16 is primarily magnetically coupled to the reflective film 51.

Figure 6:
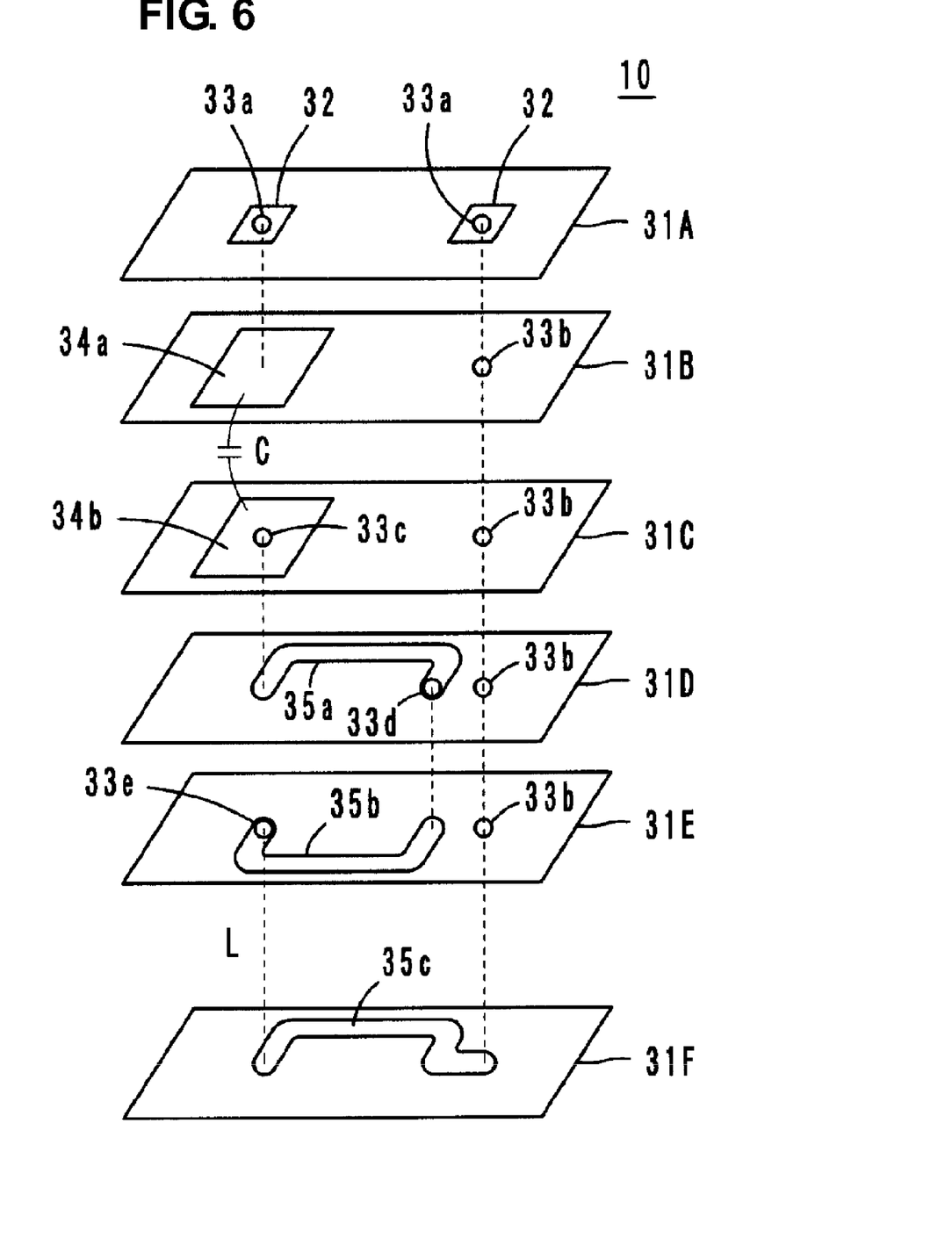
FIG. 6 is an exploded perspective view of the feeder circuit substrate according to the first preferred embodiment of the present invention.

Specifically, as illustrated in FIG. 6, the feeder circuit substrate 10 is constructed by laminating, pressing and bonding, and sintering of dielectric ceramic sheets 31A to 31F. The sheet 31A includes a connection electrode 32 and a via-hole conductor 33a. The sheet 31B includes a capacitor electrode 34a and a via-hole conductor 33b. The ceramic sheet 31C includes a capacitor electrode 34b and via-hole conductors 33c and 33b. The sheet 31C includes a capacitor electrode 34b and via-hole conductors 33c and 33b. The sheet or sheets 31D include a conductor pattern 35a and via-hole conductors 33d and 33b. The sheet or sheets 31E include a conductor pattern 35b and via-hole conductors 33e and 33b. The sheet 31F includes a conductor pattern 35c. Each of the sheets 31A to 31F may also be a sheet made of a magnetic ceramic material. The feeder circuit substrate 10 can be easily obtained by a known process of manufacturing a multilayer substrate, such as sheet laminating method or thick-film printing method, for example.

By laminating the sheets 31A to 31F, the feeder circuit 16 is provided, which includes the series LC resonant circuit in which the inductance element L whose winding axis of the helical coil is substantially perpendicular to the reflective film 51 and the capacitance element C are connected in series to each other. The capacitor electrode 34a is connected to the connection electrode 32 through the via-hole conductor 33a and is further connected to the wireless IC chip 5 with a solder bump 6 disposed therebetween. An end of the inductance element L is connected to the connection electrode 32 through the via-hole conductor 33b and is further connected to the wireless IC chip 5 with a solder bump 6 disposed therebetween.

That is, among the components defining the feeder circuit 16, the inductance element L defined by the coil electrode pattern supplies the reflective film 51 with a transmission signal through a magnetic field, and a reception signal from the reflective film 51 is supplied to the inductance element L through a magnetic field. Accordingly, it is preferable that, of the inductance element L and the capacitance element C defining the resonant circuit in the feeder circuit substrate 10, the inductance element L be arranged closer to the reflective film 51.

The electromagnetic coupling module 1 having the above-described configuration receives a high-frequency signal (e.g., in the ultrahigh frequency (UHF) band) emitted from a reader/writer 60 (see FIG. 2) at the reflective film 51, resonates the feeder circuit 16 (the series LC resonant circuit including the inductance element L and the capacitance element C) primarily magnetically coupled to the reflective film 51, and supplies the wireless IC chip 5 with only a reception signal in a predetermined frequency band. The electromagnetic coupling module 1 extracts a predetermined energy from this reception signal, matches information stored in the wireless IC chip 5 to a predetermined frequency with the feeder circuit 16 using the extracted energy as a driving source, then conveys a transmission signal from the inductance element L of the feeder circuit 16 to the reflective film 51 through magnetic field coupling, and transmits it from the reflective film 51 to the reader/writer 60.

The function of the reader/writer 60 can preferably be installed in a DVD/CD playback drive device, for example. To prevent unauthorized discs from being played, a soft key (i.e., encryption key) for playback corresponding to a recorded content is recorded on a recording surface of the optical disc 50, and the soft key recorded on the recording surface is also stored in the wireless IC chip 5. In playback of the optical disc 50, the reader/writer 60, and the optical pickup 65 read the respective soft keys, and the content is played only when the read soft keys match each other. Alternatively, a key to permit playback may be stored in the wireless IC chip 5. The wireless IC chip 5 can store various types of information regarding the optical disc 50, other than information preventing unauthorized duplication, and the stored information can be updated, instead of being read by the reader/writer 60. The information can also be used to detect theft from a store.

In the optical disc 50, the electromagnetic coupling module 1 is electromagnetically coupled to the reflective film made of an aluminum-deposited film, for example. An excitation of the reflective film 51 improves the electromagnetic-wave radiation efficiency. As compared to when the reflective film 51 is not used, an increase of an approximately 20-dB gain is obtained, and the communication distance to the reader/writer 60 increases by approximately 10 times. The feeder circuit 16 and the reflective film 51 are coupled primarily through a magnetic field. However, coupling through an electric field may also be present.

In the electromagnetic coupling module 1, the wireless IC chip 5 is DC connected directly on the feeder circuit substrate 10 including the feeder circuit 16. The feeder circuit substrate 10 has substantially the same size as the wireless IC chip 5 and is rigid. Due to this arrangement, the wireless IC chip 5 can be precisely positioned on the feeder circuit substrate 10. Additionally, because the feeder circuit substrate 10 is made of a ceramic material and is resistant to heat, the wireless IC chip 5 can be attached to the feeder circuit substrate 10 by soldering. That is, because ultrasonic bonding is not used, the wireless IC chip 5 can be inexpensively attached, there is no risk of breaking the wireless IC chip 5 by pressure applied in ultrasonic bonding, and the self-alignment achieved by reflow soldering can also be utilized.

In the feeder circuit 16, the resonant-frequency characteristic is determined by the resonant circuit including the inductance element L and the capacitance element C. The resonant frequency of a signal emitted from the reflective film 51 is substantially equivalent to the self-resonant frequency of the feeder circuit 16, and the maximum gain of the signal is substantially determined by at least one of the size of the feeder circuit 16, the shape thereof, the distance between the feeder circuit 16 and the reflective film 51, and the medium. That is, in preferred embodiments of the present invention, because the frequency of a signal emitted from the reflective film 51 is substantially determined by the resonant frequency of the resonant circuit (i.e., the feeder circuit 16), the frequency characteristic is substantially independent of the electrical length and shape of the reflective film 51.

In the feeder circuit 16, the coil electrode pattern is arranged such that its winding axis is substantially perpendicular to the reflective film 51. Thus, advantages are obtained in which the magnetic-flux component to the reflective film 51 is increased, the transmission efficiency of the signal energy is improved, and the gain is increased.

In preferred embodiments of the present invention, the resonant circuit may also function as a matching circuit to match the impedance of the wireless IC chip 5 and that of the reflective film 51. Alternatively, the feeder circuit substrate may further include a matching circuit that includes an inductance element and a capacitance element and that is provided separately from the resonant circuit. To add the function of the matching circuit to the resonant circuit, the design of the resonant circuit is relatively complicated. If the matching circuit is provided separately from the resonant circuit, the resonant circuit and the matching circuit can be designed independently.

Second Preferred of Feeder Circuit Substrate According to the Present Invention

Figure 7:
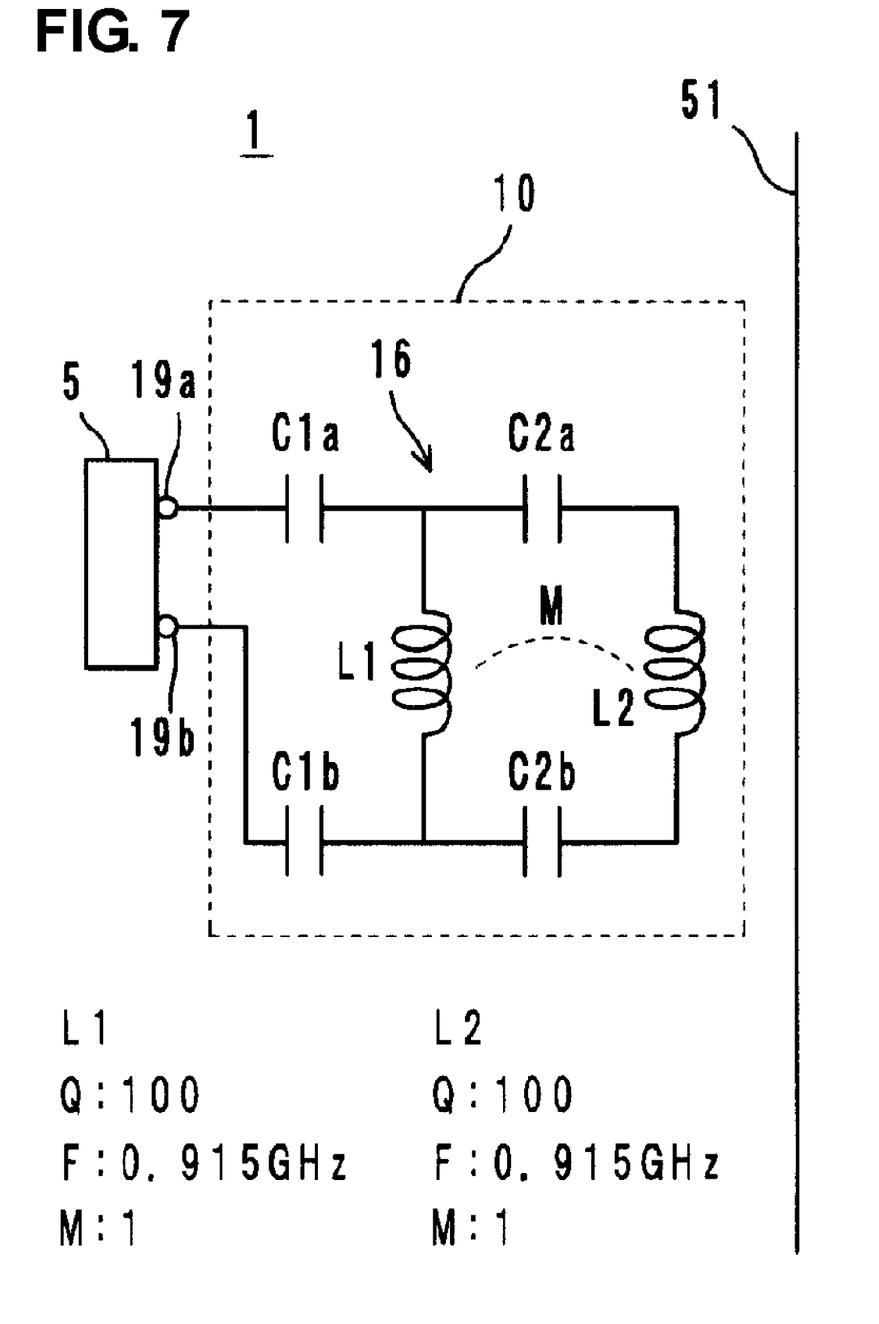
FIG. 7 is an equivalent circuit diagram that illustrates a feeder circuit substrate according to a second preferred embodiment of the present invention.

In the feeder circuit substrate 10 according to the second preferred embodiment, as illustrated in the equivalent circuit diagram of FIG. 7, the feeder circuit 16 includes magnetically coupled inductance elements L1 and L2. The inductance element L1 is connected to feed terminals 19a and 19b connected to the wireless IC chip 5 through capacitance elements C1a and C1b. The inductance element L1 is also connected in parallel to the inductance element L2 through capacitance elements C2a and C2b. In other words, the feeder circuit 16 includes a series LC resonant circuit including the inductance element L1 and the capacitance elements C1a and C1b and a series LC resonant circuit including the inductance element L2 and the capacitance elements C2a and C2b. The resonant circuits are connected by magnetic field coupling M illustrated in FIG. 7. Both of the inductance elements L1 and L2 are magnetically coupled to the reflective film 51 of the optical disc 50, which is illustrated in FIGS. 1 and 2.

Figure 8:
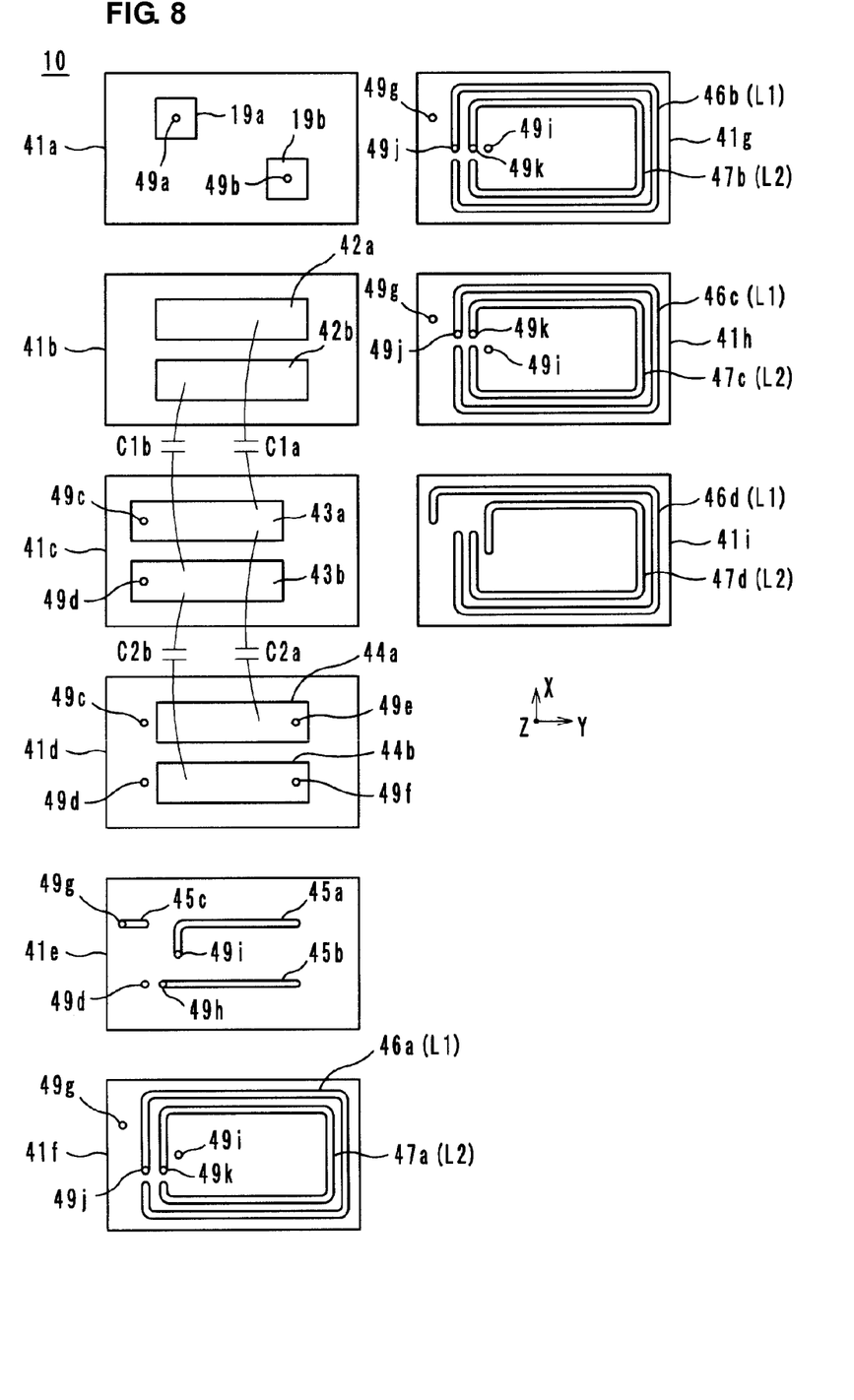
FIG. 8 is an exploded plan view of the feeder circuit substrate according to the second preferred embodiment of the present invention.

Specifically, as illustrated in FIG. 8, the feeder circuit substrate 10 is constructed by laminating, pressing and bonding, and sintering of dielectric ceramic sheets 41a to 41i. More specifically, the sheet 41a includes the feed terminals 19a and 19b and via-hole conductors 49a and 49b. The sheet 41b includes capacitor electrodes 42a and 42b. The sheet 41c includes capacitor electrodes 43a and 43b and via-hole conductors 49c and 49d. The sheet 41d includes capacitor electrodes 44a and 44b and via-hole conductors 49c, 49d, 49e, and 49f.

The sheet 41e includes connection conductor patterns 45a, 45b, and 45c and via-hole conductors 49d, 49g, 49h, and 49i. The sheet 41f includes conductor patterns 46a and 47a and via-hole conductors 49g, 49i, 49j, and 49k. The sheet 41g includes conductor patterns 46b and 47b and via-hole conductors 49g, 49i, 49j, and 49k. The sheet 41h includes conductor patterns 46c and 47c and via-hole conductors 49g, 49i, 49j, and 49k. Moreover, the sheet 41i includes conductor patterns 46d and 47d.

By laminating the sheets 41a to 41i, the conductor patterns 46a to 46d are connected together through the via-hole conductor 49j, thus defining the inductance element L1, and the conductor patterns 47a to 47d are connected together through the via-hole conductor 49k, thus defining the inductance element L2. The capacitance element C1a includes the electrodes 42a and 43a. The capacitance element C1b includes the electrodes 42b and 43b. The capacitance element C2a includes the electrodes 43a and 44a. The capacitance element C2b includes the electrodes 43b and 44b.

The inductance element L1 includes one end connected to the capacitor electrode 43a through the via-hole conductor 49g, the connection conductor pattern 45c, and the via-hole conductor 49c and another end connected to the capacitor electrode 43b through the via-hole conductor 49d. The inductance element L2 includes one end connected to the capacitor electrode 44a through the via-hole conductor 49i, the connection conductor pattern 45a, and the via-hole conductor 49e and another end connected to the capacitor electrode 44b through the via-hole conductor 49h, the connection conductor pattern 45b, and the via-hole conductor 49f.

The feed terminal 19a is connected to the capacitor electrode 42a through the via-hole conductor 49a. The feed terminal 19b is connected to the capacitor electrode 42b through the via-hole conductor 49b.

In the feeder circuit substrate 10 having the above-described configuration, the series LC resonant circuits including the magnetically coupled inductance elements L1 and L2 resonate, and the inductance elements L1 and L2 function as a radiating element. Coupling the inductance elements L1 and L2 through the capacitance elements C2a and C2b enables the resonant circuits to function as a matching circuit to match the impedance of the wireless IC chip 5 (typically about 50Ω) connected to the feed terminals 19a and 19b and that of air (about 377Ω).

The coupling coefficient k for the adjacent inductance elements L1 and L2 is represented by $k2=M/(L1 \times L2)$, and is preferably at least about 0.1, and in the second preferred embodiment, is approximately 0.8975, for example. Because each of the series LC resonant circuits including the capacitance elements C1a, C1b, C2a, and C2b and the inductance elements L1 and L2 is a lumped-constant resonant circuit, the series LC resonant circuits can be miniaturized as a laminated type. In addition, because the capacitance elements C1a and C1b are disposed between the feed terminals 19a and 19b and the inductance elements, a low-frequency surge can be cut off, so the wireless IC chip 5 can be protected against the surge.

Figure 9:
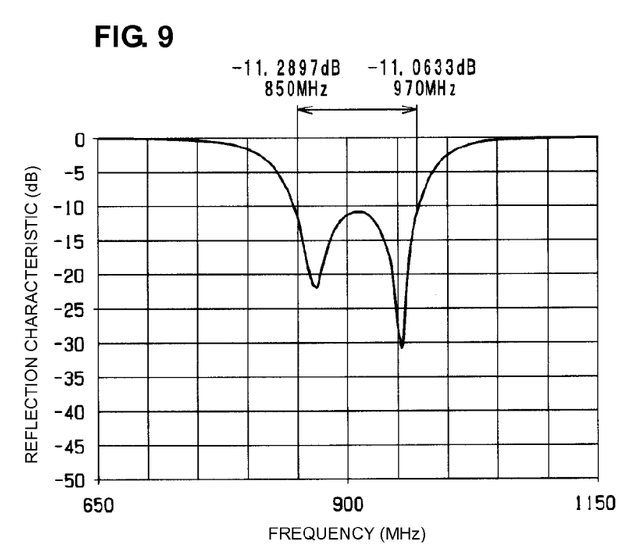
FIG. 9 is a graph that illustrates a reflection characteristic of an electromagnetic coupling module that uses the second preferred embodiment of the present invention.

From results of a simulation performed by the inventors of the present invention based on the equivalent circuit illustrated in FIG. 7, the reflection characteristic illustrated in FIG. 9 for the feeder circuit substrate 10 was obtained. As shown in FIG. 9, the center frequency is about 915 MHz, a reflection characteristic of about −10 dB or less in a wide band of about 850 MHz to about 970 MHz was obtained.

Figure 10:
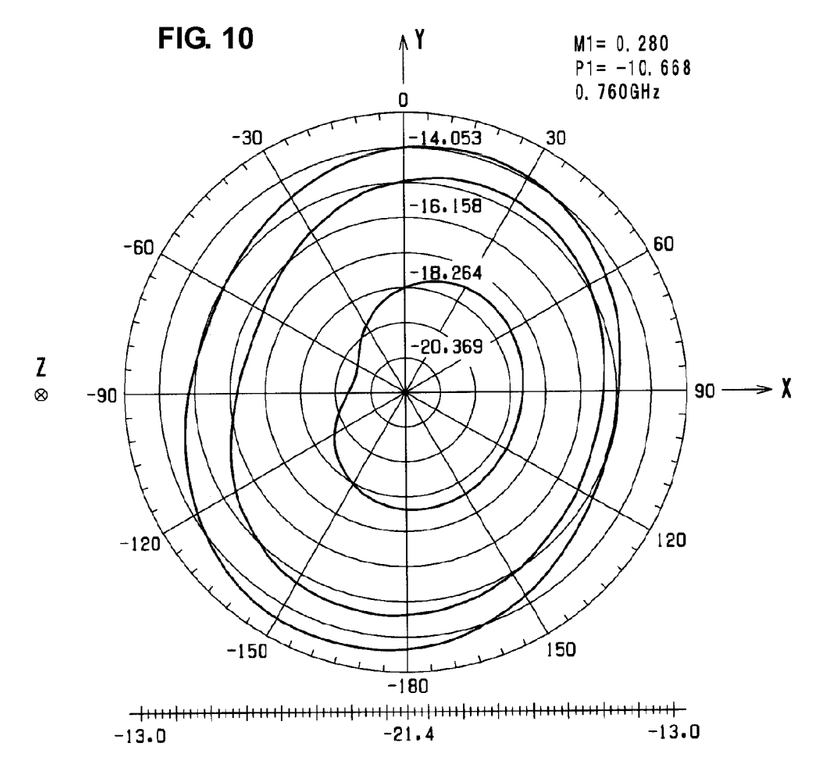
FIG. 10 is a chart in the XY plane that illustrates directivity of the electromagnetic coupling module using the second preferred embodiment of the present invention.

FIG. 10 illustrates the directivity (i.e., the magnetic field strength) in the XY plane of the feeder circuit substrate 10. The x-axis, y-axis, and z-axis correspond to the arrows X, Y, and Z illustrated in FIG. 2, respectively.

The operational advantage of the second preferred embodiment is substantially the same as that of the first preferred embodiment, and the second preferred embodiment can effectively prevent playback of an unauthorized duplication of the optical disc. That is, the electromagnetic coupling module 1 receives a high-frequency signal (e.g., in the UHF band) emitted from the reader/writer 60 at the reflective film 51, resonates the feeder circuit 16 (the series LC resonant circuit including the inductance element L1 and the capacitance elements C1a and C1b and the series LC resonant circuit including the inductance element L2 and the capacitance elements C2a and C2b) primarily magnetically coupled to the reflective film 51, and supplies the wireless IC chip 5 with only a reception signal in a predetermined frequency band. The electromagnetic coupling module 1 extracts a predetermined energy from this reception signal, matches information retained in the wireless IC chip 5 to a predetermined frequency with the feeder circuit 16 using the extracted energy as a driving source, then conveys a transmission signal from the inductance elements L1 and L2 of the feeder circuit 16 to the reflective film 51 through magnetic field coupling, and transmits it from the reflective film 51 to the reader/writer 60.

In particular, in the second preferred embodiment, the reflection characteristic has a wide frequency band, as illustrated in FIG. 9. This results from the feeder circuit 16 being defined by the plurality of LC resonant circuits including the magnetically coupled inductance elements L1 and L2 with a high degree of coupling.

The optical disc according to preferred embodiments of the present invention is not limited to the above-described preferred embodiments. Various modifications can be made without departing from the scope of the invention.

For example, the resonant circuit(s) defining the feeder circuit may have various circuit configurations, such as a series LC resonant circuit or a parallel LC resonant circuit, and may be either a lumped-constant type or a distributed-constant type. Information stored in the wireless IC chip and the use of the information by using the reader/writer may have any form.

As described above, preferred embodiments of the present invention are useful for an optical disc. In particular, preferred embodiments of the present invention are advantageous in that they include an electromagnetic coupling module having high electromagnetic-wave radiation efficiency in a wide band and are suitable for copyright protection.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An optical disc comprising:
   a reflective film defined by a metal thin film;
   a wireless IC chip; and
   a feeder circuit including a conductor pattern connected to the wireless IC chip; wherein
   the conductor pattern is arranged to overlap a portion of the reflective film such that the conductor pattern is electromagnetically coupled with the reflective film; and
   the reflective film defines an antenna or a radiation pattern.

2. The optical disc according to claim 1, wherein the feeder circuit is provided adjacent to a central hole in the reflective film.

3. The optical disc according to claim 1, wherein the feeder circuit includes a resonant circuit having a predetermined resonant frequency, and the conductor pattern defines the resonant circuit.

4. The optical disc according to claim 3, wherein the resonant circuit includes at least one of a coil electrode pattern and a capacitor electrode pattern.

5. The optical disc according to claim 4, wherein the resonant circuit includes the coil electrode pattern, and a winding axis of the coil electrode pattern is substantially perpendicular to the reflective film.

6. The optical disc according to claim 1, further comprising a resin layer, wherein the reflective film is provided in the resin layer, and the wireless IC chip is embedded in the resin layer.

* * * * *